US012538759B2

(12) United States Patent
Milton et al.

(10) Patent No.: US 12,538,759 B2
(45) Date of Patent: Jan. 27, 2026

(54) METHODS OF DETERMINING A HEIGHT, AND A HEIGHT PROFILE, OF A WIRE LOOP ON A WIRE BONDING MACHINE

(71) Applicant: Kulicke and Soffa Industries, Inc., Fort Washington, PA (US)

(72) Inventors: Basil Milton, Fort Washington, PA (US); Wei Qin, Fort Washington, PA (US); Zhijie Wang, Fort Washington, PA (US); Vladimir Pribula, Fort Washington, PA (US); Pavel Shusharin, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 414 days.

(21) Appl. No.: 18/125,152

(22) Filed: Mar. 23, 2023

(65) Prior Publication Data

US 2023/0335532 A1   Oct. 19, 2023

Related U.S. Application Data

(60) Provisional application No. 63/331,130, filed on Apr. 14, 2022.

(51) Int. Cl.
*H01L 23/00* (2006.01)
*H01L 21/66* (2006.01)

(52) U.S. Cl.
CPC .............. *H01L 24/85* (2013.01); *H01L 22/20* (2013.01); *H01L 2224/85181* (2013.01); *H01L 2224/859* (2013.01)

(58) Field of Classification Search
CPC ......... H01L 24/78; H01L 22/20; H01L 24/48; H01L 24/85; H01L 2224/859;
(Continued)

(56) References Cited

U.S. PATENT DOCUMENTS 6,059,846 A    5/2000  Arai et al.
6,189,765 B1   2/2001  Moon
(Continued)

FOREIGN PATENT DOCUMENTS

JP          11330168        11/1999
KR     20-19980061411      11/1998
(Continued)

OTHER PUBLICATIONS

International Search Report for PCT application No. PCT/US2023/015989 mailed Jul. 12, 2023.

*Primary Examiner* — Didarul A Mazumder
(74) *Attorney, Agent, or Firm* — Christopher M. Spletzer, Sr.

(57) ABSTRACT

A method of determining a height value of a wire loop on a wire bonding machine is provided. The method includes the steps of: (a) imaging at least a portion of a wire loop using an imaging system on a wire bonding machine to detect a path of the portion of the wire loop; (b) moving a wire bonding tool towards a first contact portion of the wire loop in the path; (c) detecting when a portion of a conductive wire engaged with the wire bonding tool contacts the first contact portion of the wire loop; and (d) determining a height value of the wire loop at the first contact portion based on a position of the wire bonding tool when the portion of the conductive wire contacts the first contact portion of the wire loop.

20 Claims, 11 Drawing Sheets

(58) Field of Classification Search
CPC ........ H01L 2224/789; H01L 21/67288; G01B 11/026; G01N 19/04
USPC .......................................................... 438/14
See application file for complete search history.

(56) References Cited

U.S. PATENT DOCUMENTS

| | | | |
|---|---|---|---|
| 6,758,385 B2* | 7/2004 | Farassat | G01N 19/04 |
| | | | 228/103 |
| 7,188,759 B2 | 3/2007 | Calpito et al. | |
| 2003/0146263 A1 | 8/2003 | Farassat | |
| 2005/0094865 A1* | 5/2005 | Cheng | G01B 11/026 |
| | | | 356/602 |
| 2005/0133563 A1* | 6/2005 | Kim | H01L 24/78 |
| | | | 228/110.1 |
| 2010/0059574 A1* | 3/2010 | Arahata | H01L 24/48 |
| | | | 228/110.1 |
| 2011/0180590 A1* | 7/2011 | Akiyama | H01L 24/85 |
| | | | 228/103 |
| 2022/0115253 A1* | 4/2022 | Wong | H01L 21/67288 |

FOREIGN PATENT DOCUMENTS

| | | |
|---|---|---|
| KR | 10-0269087 | 12/2000 |
| WO | 2009002345 A1 | 8/2003 |
| WO | 2009/002345 | 12/2008 |

\* cited by examiner

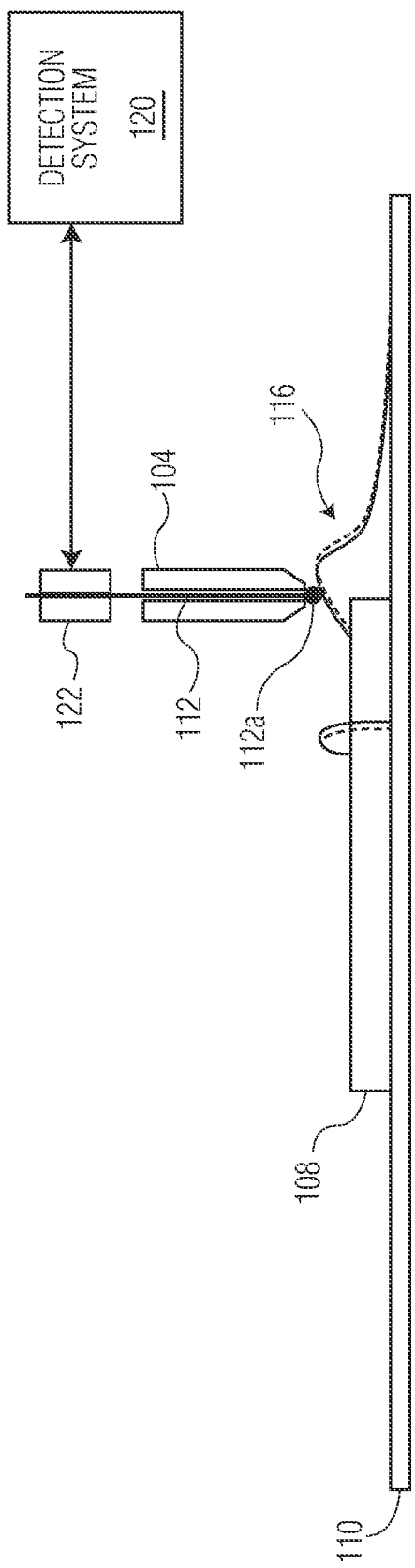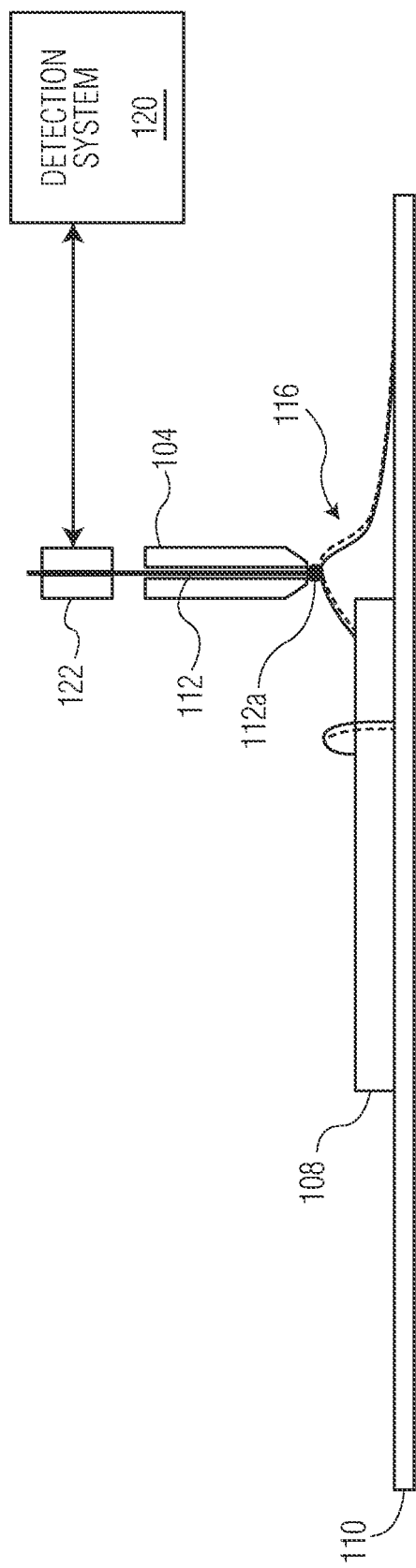

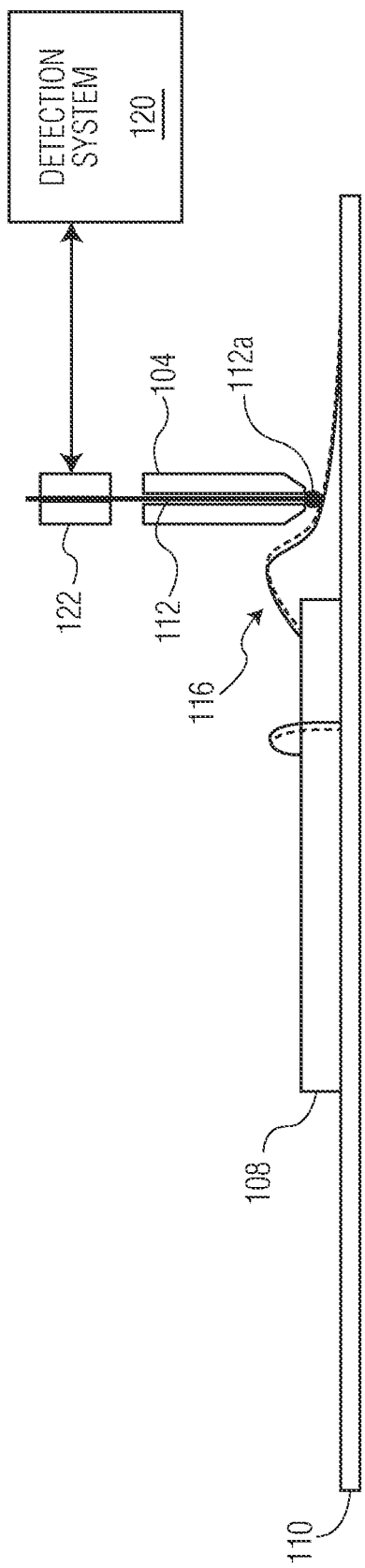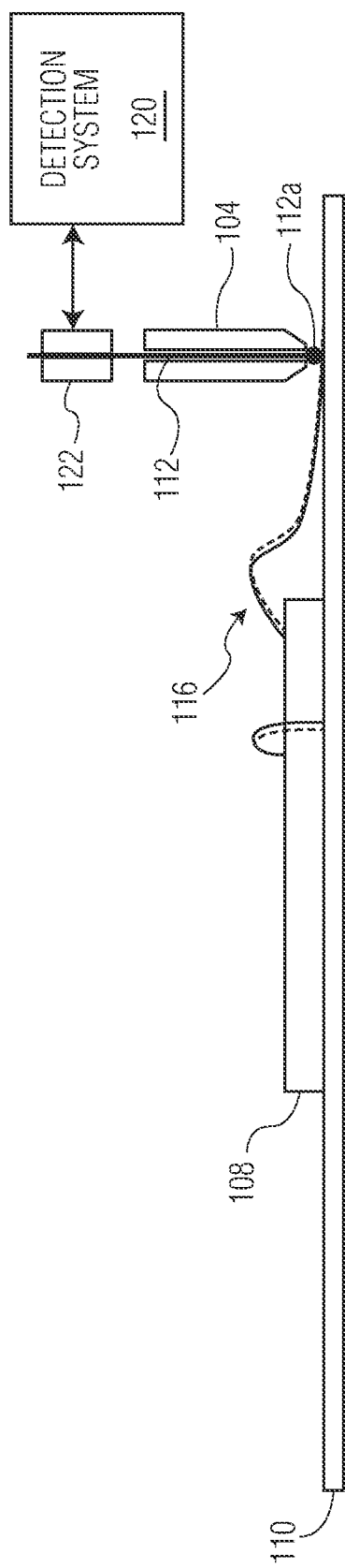

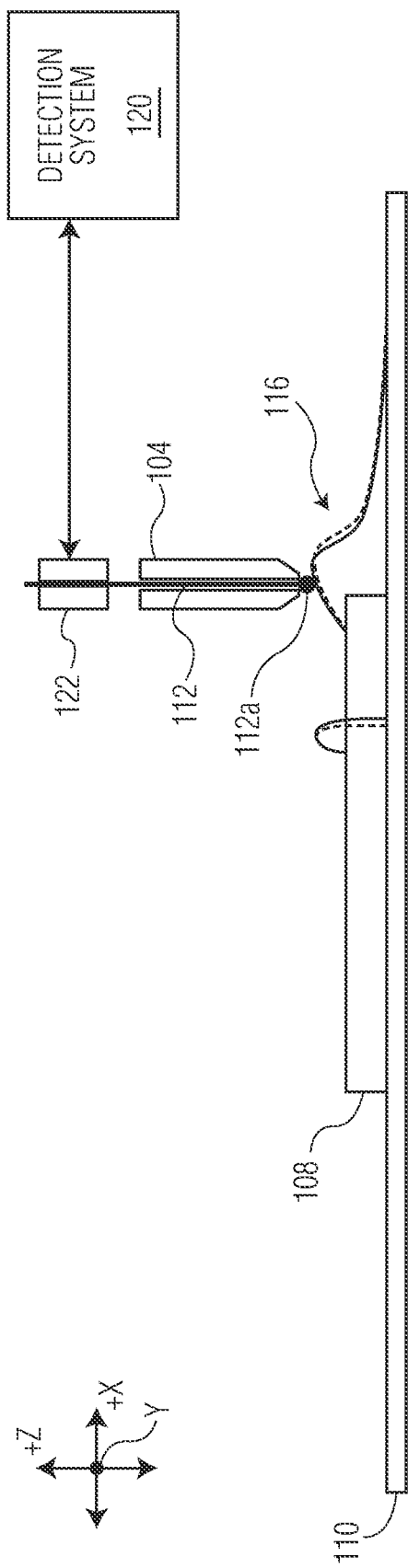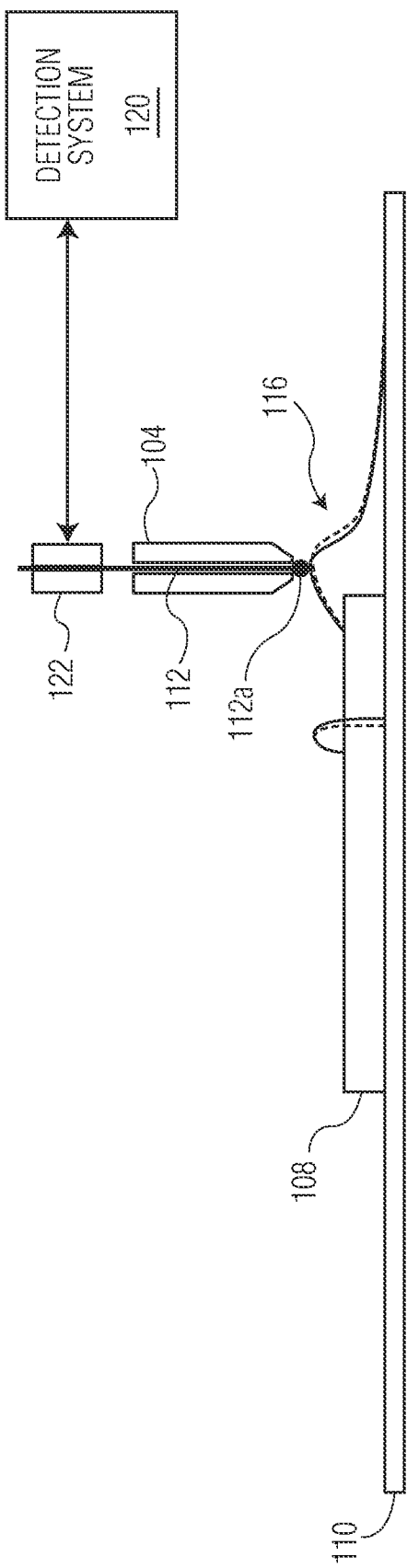

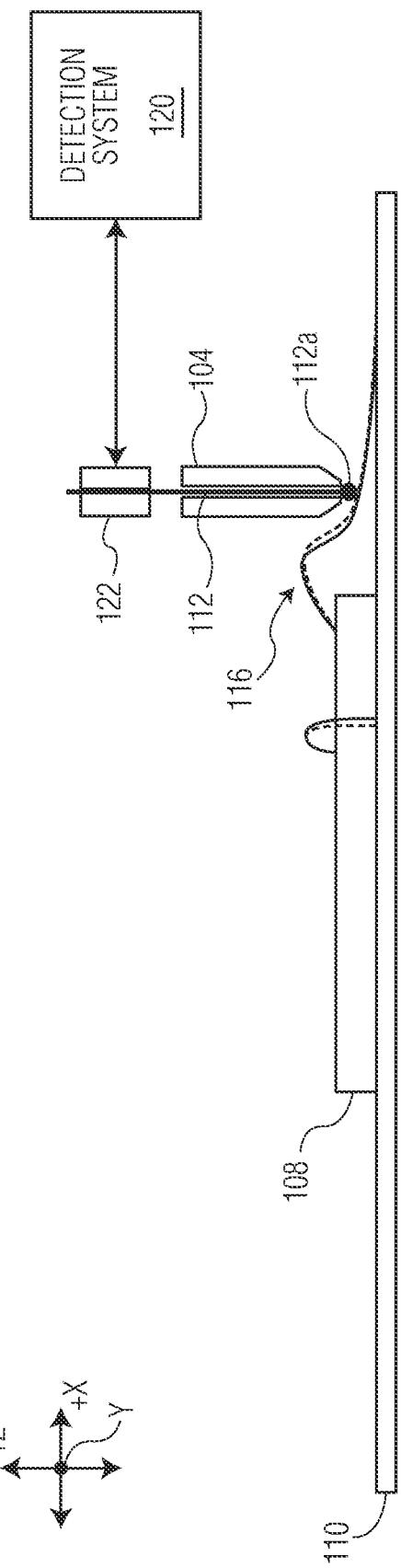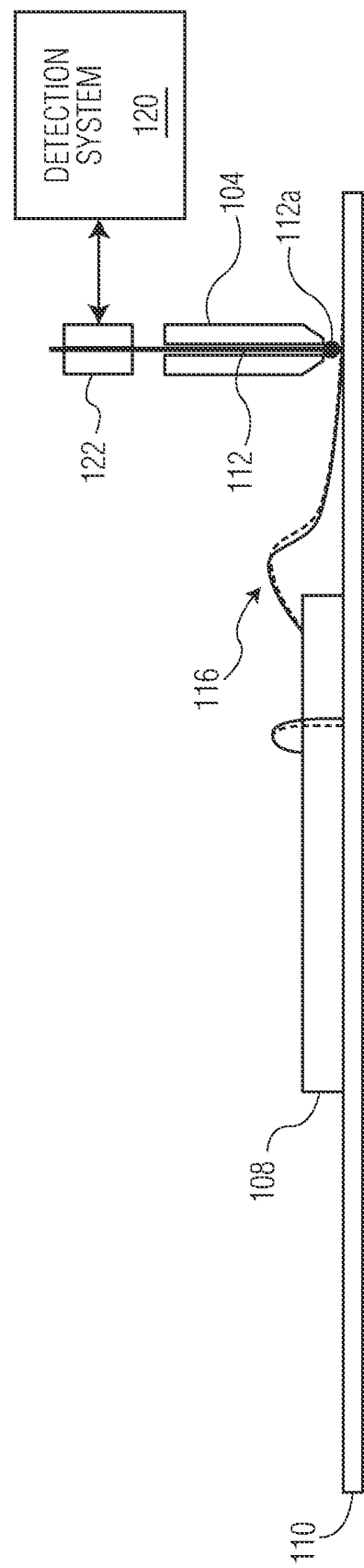

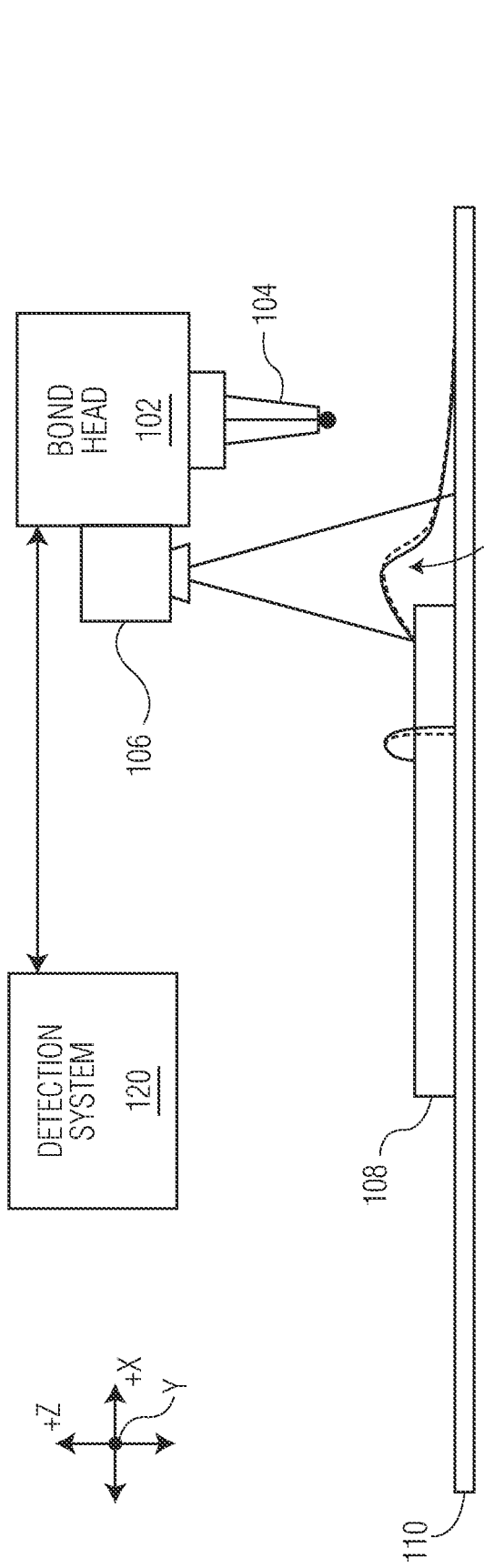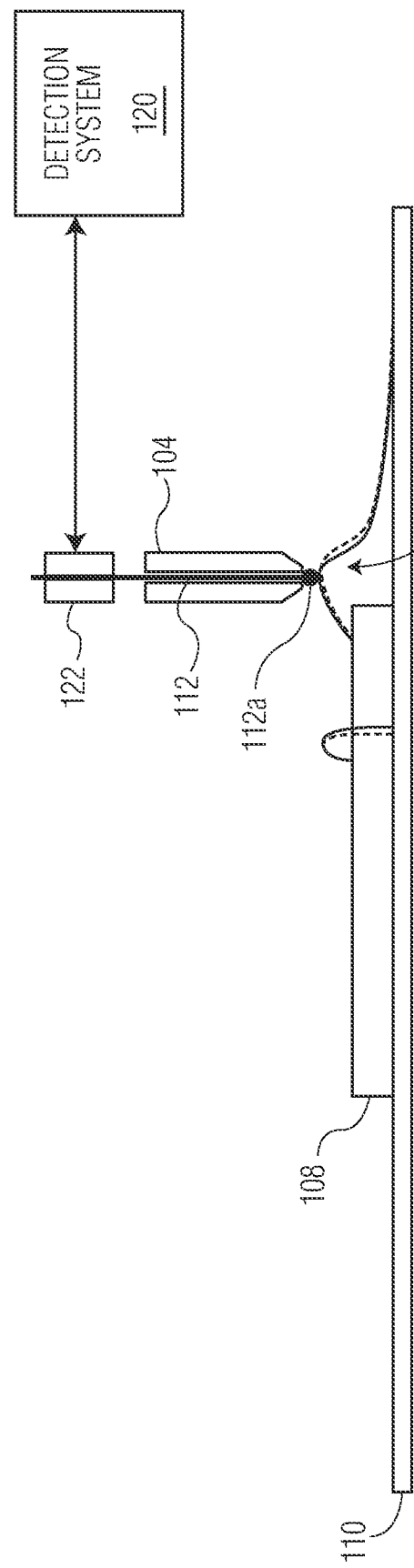

METHODS OF DETERMINING A HEIGHT, AND A HEIGHT PROFILE, OF A WIRE LOOP ON A WIRE BONDING MACHINE

CROSS REFERENCE TO RELATED APPLICATION

This application claims the benefit of U.S. Provisional Application No. 63/331,130, filed on Apr. 14, 2022, the content of which is herein incorporated by reference.

FIELD

The invention relates to wire bonding operations, and in particular, to methods of determining a height value and a height profile of a wire loop on a wire bonding machine.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., stud bumping machines) are also used to form conductive bumps from portions of wire.

It is often desirable to know a height of a wire loop (e.g., a maximum height, or another height at a given location along a length of a wire loop). International Patent Application Publication WO 2009/002345 (entitled "METHOD OF DETERMINING A HEIGHT PROFILE OF A WIRE LOOP ON A WIRE BONDING MACHINE") describes conventional techniques for performing height measurements of wire loops, and is herein incorporated by reference in its entirety. Such conventional techniques may be used to measure a height of a wire loop along a desired path; however, in certain the situations, the actual path of a wire loop may be different from a desired or "design" path. For example, wire sway or wire leaning may result in a variation of the actual path of the wire loop—making measurement of the height of such conventional techniques unreliable.

Thus, it would be desirable to provide improved methods of determining the height of a wire loop, and/or a height profile of a wire loop.

SUMMARY

According to an exemplary embodiment of the invention, a method of determining a height value of a wire loop on a wire bonding machine is provided. The method includes the steps of: (a) imaging at least a portion of a wire loop using an imaging system on a wire bonding machine to detect a path of the portion of the wire loop; (b) moving a wire bonding tool towards a first contact portion of the wire loop in the path; (c) detecting when a portion of a conductive wire engaged with the wire bonding tool contacts the first contact portion of the wire loop; and (d) determining a height value of the wire loop at the first contact portion based on a position of the wire bonding tool when the portion of the conductive wire contacts the first contact portion of the wire loop.

According to another exemplary embodiment of the invention, a method of determining a height profile of a wire loop on a wire bonding machine is provided. The method includes the steps of: (a) imaging at least a portion of a wire loop using an imaging system on a wire bonding machine to detect a path of the portion of the wire loop; (b) moving a wire bonding tool towards a first contact portion of the wire loop in the path; (c) detecting when a portion of a conductive wire engaged with the wire bonding tool contacts the first contact portion of the wire loop; (d) determining a height value of the wire loop at the first contact portion based on a position of the wire bonding tool when the portion of the conductive wire contacts the first contact portion of the wire loop; and (e) repeating steps (b), (c), and (d) for a plurality of additional contact portions of the wire loop such that a plurality of height values are determined.

The methods of the present invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 2A-2G are block diagram side views of the wire bonding machine and the workpiece of FIG. 1A, illustrating a method of determining a height profile of a wire loop in accordance with an exemplary embodiment of the invention;

FIGS. 3A-3E are block diagram side views of the wire bonding machine and the workpiece of FIG. 1A, illustrating another method of determining a height profile of a wire loop in accordance with an exemplary embodiment of the invention;

FIGS. 4A-4B are block diagram side views of the wire bonding machine and the workpiece of FIG. 1A, illustrating a method of determining a height of a wire loop in accordance with an exemplary embodiment of the invention;

DETAILED DESCRIPTION

As will be appreciated by those skilled in the art, there is typically a difference between a desired wire loop shape and an actual wire loop shape. Using techniques such as those disclosed in the aforementioned International Patent Application Publication WO 2009/002345, a loop height measurement may be completed. However, such a loop height measurement may be very inaccurate if the actual wire loop does not have the desired (e.g., "design") shape. For example, the actual wire loop may experience wire "sway" or wire "lean" which results in a different shape in the x-y plane.

Aspects of the invention use an imaging system (e.g., a camera) on a wire bonding machine (e.g., in connection with a computer on the wire bonding machine) to determine the actual path of a wire loop (including any wire sway or wire lean). With the actual path provided using the imaging system, the actual wire loop height may be determined.

Aspects of the invention use images provided by an imaging system to measure wire sway and/or wire lean defects of a wire loop to establish feedback of robust x-axis, y-axis, and/or z-axis information in order to enable closed-loop control of wire loop shapes.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, etc.), a packaged semiconductor device, a flip chip semiconductor device, a die embedded in a substrate, a stack of semiconductor die, a plurality of semiconductor die on a substrate, amongst others. Further, the semiconductor element may include an element configured to be bonded or otherwise included in a semiconductor package (e.g., a spacer to be bonded in a stacked die configuration, a substrate, etc.).

As used herein, the term "height value" may refer to an actual height value of a portion of a wire loop, or a relative height value of a wire loop.

As used herein, the term, "height profile" refers to a plurality of height values along a length of a wire loop.

Figure 1A:
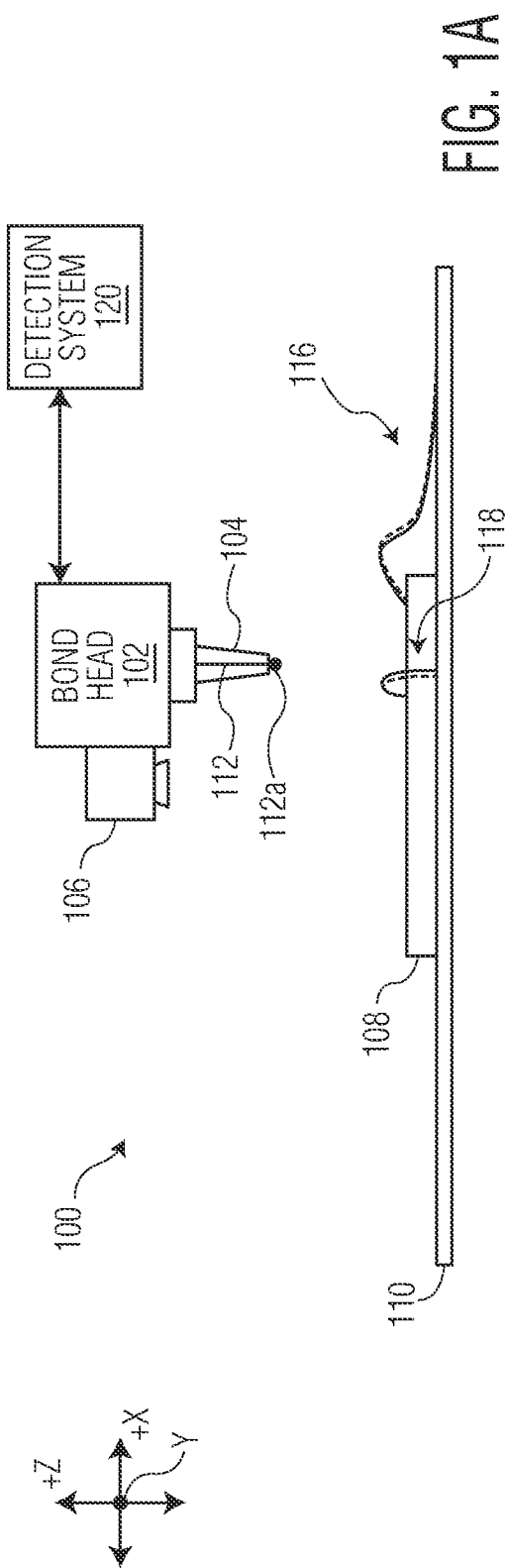
FIG. 1A is a block diagram side view of a wire bonding machine, and a workpiece on the wire bonding machine, useful for illustrating various exemplary embodiments of the invention.

Referring now to FIG. 1A, a wire bonding machine 100 is illustrated. Wire bonding machine 100 includes a bond head 102 carrying an imaging system 106 (e.g., a camera). A wire bonding tool 104 is carried by bond head 102. A conductive wire 112 is illustrated through wire bonding tool 104, terminating at a free air ball (FAB) 112a seated at the tip of wire bonding tool 104. Wire bonding machine 100 also includes a detection system 120 (e.g., sometimes referred to as a BITS system, bond integrity test system). Detection system 120 (which includes a computer, or a computer connection) is used to detect a conductive coupling or connection between free air ball 112a and a portion of a wire loop (e.g., wire loop 116) (where such a conductive coupling may be established by way of a wire clamp 122 shown in FIGS. 2D-2G). A semiconductor element 108 (e.g., a semiconductor die) is illustrated on a substrate 110 (e.g., a leadframe). Wire loops 116 and 118 are illustrated providing electrical interconnection between semiconductor element 108 (e.g., with a "first bond" at a bonding location 108a, as in FIG. 1B) and substrate 110 (e.g., with a "second bond" at a bonding location 110a, as in FIG. 1B).

Figure 1B:
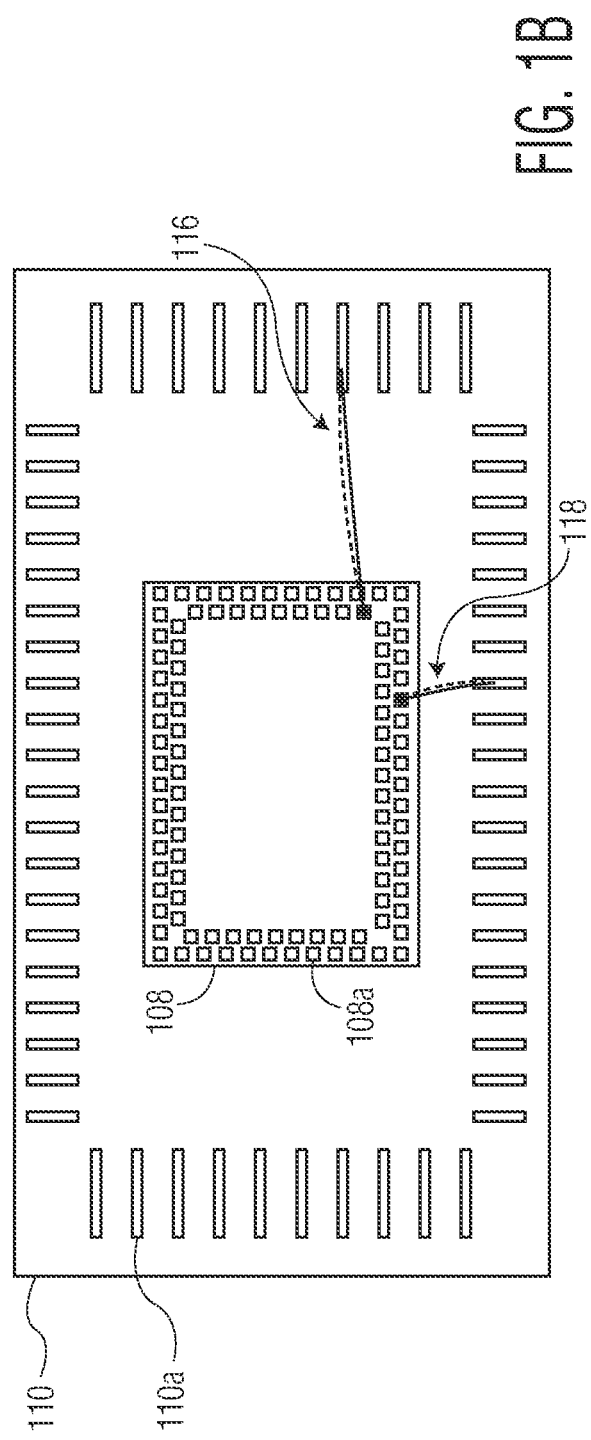
FIG. 1B is a top view of the workpiece of FIG. 1A.

Referring now to FIG. 1B, the electrical interconnection of wire loops 116 and 118 is further illustrated in a top view of semiconductor element 108 and substrate 110. Substrate 110 (e.g., a lead frame) includes a plurality of bonding locations 110a (e.g., leads of a leadframe). Semiconductor element 108 includes a plurality of bonding locations 108a (e.g., bond pads). Wire loops 116 and 118 are illustrated in a "dashed form" (to illustrate a "design" or "simulated" wire loop) and a "solid form" (to illustrate an "actual" or "formed" wire loop).

Figure 2A:
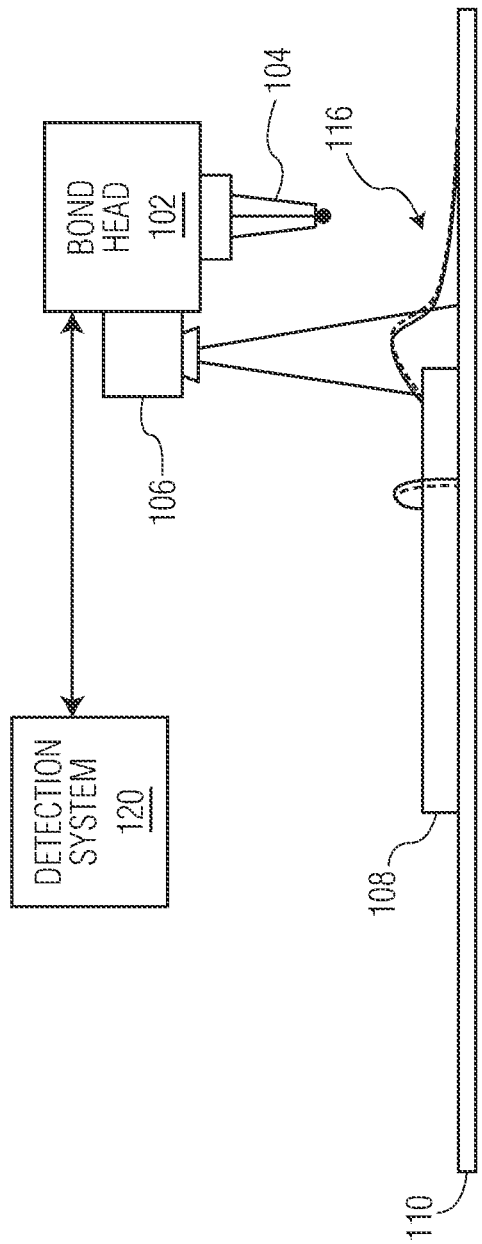
Figure 2B:
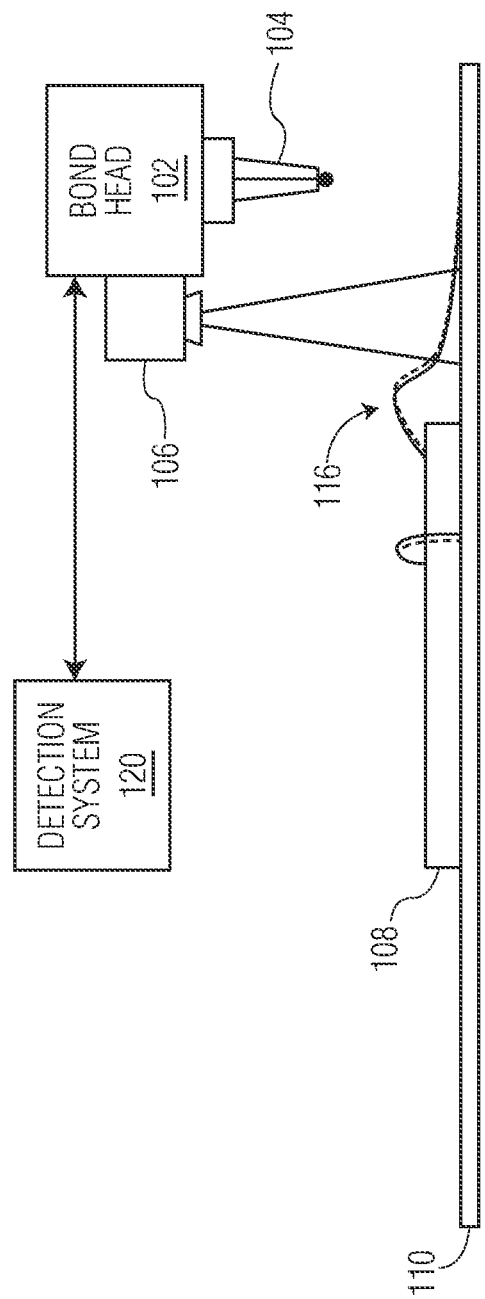
Figure 2C:
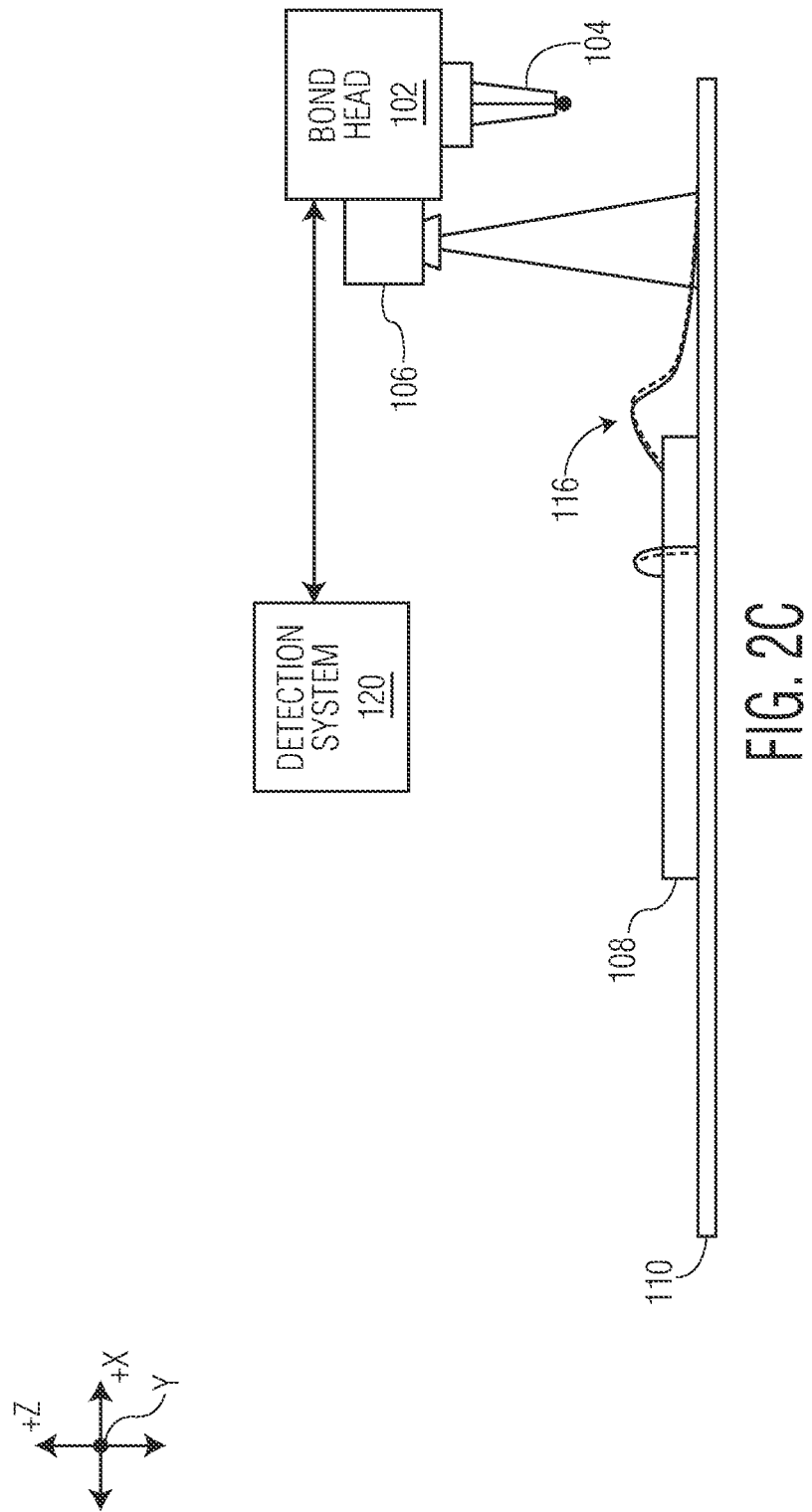

Referring now to FIGS. 2A-2C, imaging system 106 (e.g., imaging system 106 of wire bonding machine 100) is illustrated imaging (e.g., "scanning") along the length of wire loop 116 to capture a path of wire loop 116 (e.g., the path in the x-y plane). Referring specifically to FIG. 2A, imaging system 106 is illustrated imaging a portion of wire loop 116, more specifically a portion including the "top" of wire loop 116 (e.g., the portion of the wire loop with the greatest "height" with respect to substrate 110). FIG. 2A also illustrates imaging system 106 imaging an area including a portion of semiconductor element 108 and/or a first bond location of wire loop 116. Referring now to FIG. 2B, imaging system 106 and bond head 102 have been moved along an x-axis (i.e., along the +x-direction). In FIG. 2B, imaging system 106 is illustrated scanning another portion of wire loop 116, more specifically a portion including the "middle" of wire loop 116. Referring now to FIG. 2C, imaging system 106 and bond head 102 have been moved along an x-axis (i.e., along the +x-direction). In FIG. 2C, imaging system 106 is illustrated scanning yet another portion of wire loop 116, more specifically a portion including the "outermost" portion of wire loop 116 (i.e., the portion farthest in the +x-direction). In FIG. 2C, imaging system 106 is also illustrated imaging an area including a portion of substrate 110 and/or a second bond location of wire loop 116.

Through the imaging operation of FIGS. 2A-2C, a path of wire loop 116 is detected. That is, because the actual wire loop 116 may be different from a design wire loop 116 (see FIGS. 1A-1B) (e.g., because of wire sway and/or wire sweep), the imaging operation of FIGS. 2A-2C provides the actual path (e.g., the path in the x-y plane) of wire loop 116. This actual path can be used to measure the height value of portions of wire loop 166 (e.g., see FIGS. 2D-2G). In FIGS. 2A-2G, wire loop 116 is illustrated in a "dashed form" (to illustrate a "design" or "simulated" wire loop) and a "solid form" (to illustrate an "actual" or "formed" wire loop). More specifically, the path determined through the imaging operation(s) may be used to determine the locations of the wire loop (e.g., the locations of the wire loop in the x-y plane) to be contacted during the height measurements.

Referring now to FIGS. 2D-2G, wire bonding tool 104 (e.g., of wire bonding machine 100) is illustrated along a plurality of positions along wire loop 116. Referring specifically to FIG. 2D, wire bonding tool 104 has been lowered (e.g., in the −z-direction) such that free air ball 112a of conductive wire 112 contacts wire loop 116. Wire bonding tool 104 has been moved towards a first contact portion of the wire loop 116 (e.g., in the path of wire loop 116). Wire bonding tool 104 is lowered toward this first contact portion using position data (e.g., a position in the x-y plane) determined through the imaging operation(s) described above in connection with FIGS. 2A-2C. Detection system 120 (e.g., BITS) is used to detect when free air ball 112a (e.g., a portion of a conductive wire 112 engaged with the wire bonding tool 104) contacts the first contact portion of wire loop 116. This detection is accomplished, for example, by detecting an electrically conductive path between free air ball 112a and the first contact portion of wire loop 116 (where wire clamp 122, in a closed position, may be used in connection with establishing the electrically conductive path) (e.g., see the detection methods disclosed in International Patent Application Publication WO 2009/002345).

After contact is detected between free air ball 112a and the first contact portion of wire loop 116, the height is determined (e.g., is reported and stored in memory of the wire bonding machine). For example, the height of wire loop 116 at the first contact portion can be determined using a z-encoder which is a conventional component of a wire bonding system for determining a z-height of the bonding tool (i.e., the height along the z-axis or vertical axis of the wire bonding operation).

Referring now to FIG. 2E, wire bonding tool 104 has been moved along an x-axis (i.e., along the +x-direction) and along a z-axis (i.e., along the +z-direction). More specifically, wire bonding tool 104 has been moved such that free air ball 112a is illustrated in contact with wire loop 116 at the "top" of wire loop 116. Referring now to FIG. 2F, wire bonding tool 104 has been moved along the x-axis (i.e., along the +x-direction) and along the z-axis (i.e., along the −z-direction). More specifically, wire bonding tool 104 has been moved such that free air ball 112a is illustrated in contact with wire loop 116 at a "middle" portion of wire loop 116. Referring now to FIG. 2G, wire bonding tool 104 has been moved along the x-axis (i.e., along the +x-direction) and along the z-axis (i.e., along the −z-direction). More specifically, wire bonding tool 104 has been moved such that free air ball 112a is illustrated in contact with wire loop 116 at an "outermost" portion of wire loop 116 (i.e., the portion farthest in the +x-direction). Throughout the movement illustrated in FIGS. 2D-2G, detection system 120 is used to detect contact between conductive wire 112 and wire loop 116. The height of wire loop 116 at a particular portion may be determined based on the movement of wire bonding tool 104 and detection of contact between conductive wire 112 (via free air ball 112a) and wire loop 116. This may be repeated for a plurality of contact portions of wire loop 116 (e.g., wherein the plurality of contact portions of the wire loop may be spaced at predetermined increments between a first bonding point of the wire loop and a second bonding point of the wire loop) such that a height profile of wire loop 116 is determined.

Referring now to FIGS. 3A-3E, a process similar to that described in FIGS. 2A-2G is illustrated, where like elements have like reference numerals. However, in FIG. 3A the entire length of wire loop 116 is imaged in a single field of view of imaging system 106 (as compared to FIGS. 2A-2C, where wire loop 116 is imaged in a plurality of fields of view).

Figure 3A:
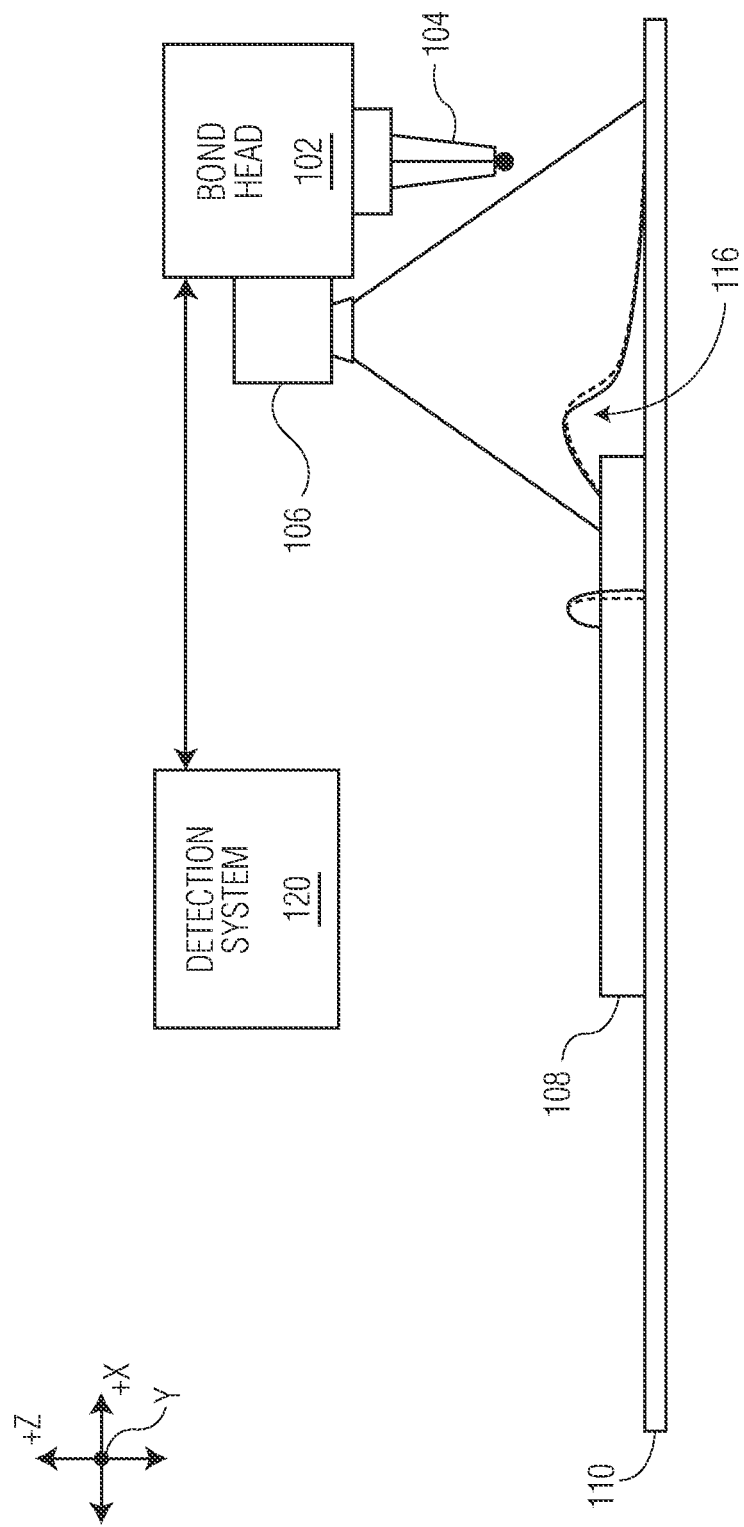

Referring specifically to FIG. 3A, imaging system 106 (e.g., imaging system 106 of wire bonding machine 100) is illustrated imaging (e.g., "scanning") the entirety of wire loop 116. Thus, the imaging illustrated in FIG. 3A includes various portions of wire loop 116 (e.g., the "top" of wire loop 116, a portion adjacent to semiconductor element 108 at a first bond location, a portion adjacent to substrate at a second bond location, a portion of semiconductor element 108, and a portion of substrate 110).

Through the imaging operation of FIG. 3A, a path of wire loop 116 is detected. That is, because the actual wire loop 116 may be different from a design wire loop 116 (see FIGS. 1A-1B) (e.g., because of wire sway and/or wire sweep), the imaging operation of FIG. 3A provides the actual path of wire loop 116. This actual path can be used to measure the height value of portions of wire loop 166 (e.g., see FIGS. 3B-3E). In FIGS. 3A-3E, wire loop 116 is illustrated in a "dashed form" (to illustrate a "design" or "simulated" wire loop) and a "solid form" (to illustrate an "actual" or "formed" wire loop).

Referring now to FIGS. 3B-3E, wire bonding tool 104 (e.g., of wire bonding machine 100) is illustrated along a plurality of positions along wire loop 116. Referring specifically to FIG. 3B, wire bonding tool 104 has been lowered (e.g., in the −z-direction) such that free air ball 112a of conductive wire 112 contacts wire loop 116. Wire bonding tool 104 has been moved towards a first contact portion of the wire loop 116 (e.g., in the path of wire loop 116). Detection system 120 (e.g., BITS) is used to detect when free air ball 112a (e.g., a portion of a conductive wire 112 engaged with the wire bonding tool 104) contacts the first contact portion of wire loop 116. Referring now to FIG. 3C, wire bonding tool 104 has been moved along an x-axis (i.e., along the +x-direction) and along a z-axis (i.e., along the +z-direction). More specifically, wire bonding tool 104 has been moved such that free air ball 112a is illustrated in contact with wire loop 116 at the "top" of wire loop 116. Referring now to FIG. 3D, wire bonding tool 104 has been moved along the x-axis (i.e., along the +x-direction) and along the z-axis (i.e., along the −z-direction). More specifically, wire bonding tool 104 has been moved such that free air ball 112a is illustrated in contact with wire loop 116 at a "middle" portion of wire loop 116. Referring now to FIG. 3E, wire bonding tool 104 has been moved along the x-axis (i.e., along the +x-direction) and along the z-axis (i.e., along the −z-direction). More specifically, wire bonding tool 104 has been moved such that free air ball 112a is illustrated in contact with wire loop 116 at an "outermost" portion of wire loop 116 (i.e., the portion farthest in the +x-direction). Throughout the movement illustrated in FIGS. 3A-3E, detection system 120 is used to detect contact between conductive wire 112 (via free air ball 112a) and wire loop 116. The height of wire loop 116 at a particular portion may be determined based on the movement of wire bonding tool 104 and detection of contact between conductive wire 112 and wire loop 116. This may be repeated for a plurality of contact portions of wire loop 116 (e.g., wherein the plurality of contact portions of the wire loop may be spaced at predetermined increments between a first bonding point of the wire loop and a second bonding point of the wire loop) such that a height profile of wire loop 116 is determined.

It will be appreciated that, according to certain exemplary embodiments of the invention, only a single height value may be determined (as opposed to determining a plurality of height values along the path of a wire loop, where the plurality of height values may be referred to as a "height profile"). FIGS. 4A-4B illustrate a process of determining a single height value along a path of a wire loop.

Referring now to FIGS. 4A-4B, a process similar to that described in FIGS. 2A-2G and FIGS. 3A-3E is illustrated, where like elements have like reference numerals. Referring specifically to FIG. 4A, imaging system 106 (e.g., imaging system 106 of wire bonding machine 100) is illustrated imaging (e.g., "scanning") a portion of wire loop 116, specifically a portion including the "top" of wire loop 116 and/or a portion adjacent to semiconductor element 108 at a first bond location. In FIG. 4B, wire bonding tool 104 has been lowered (e.g., in the −z-direction) such that free air ball 112a of conductive wire 112 contacts wire loop 116. Wire bonding tool 104 has been moved towards a first contact portion of the wire loop 116 (e.g., in the path of wire loop 116). Detection system 120 (e.g., BITS) is used to detect when free air ball 112a (e.g., a portion of a conductive wire 112 engaged with the wire bonding tool 104) contacts the first contact portion of wire loop 116, thus determining a height value of wire loop 116.

Figure 5:
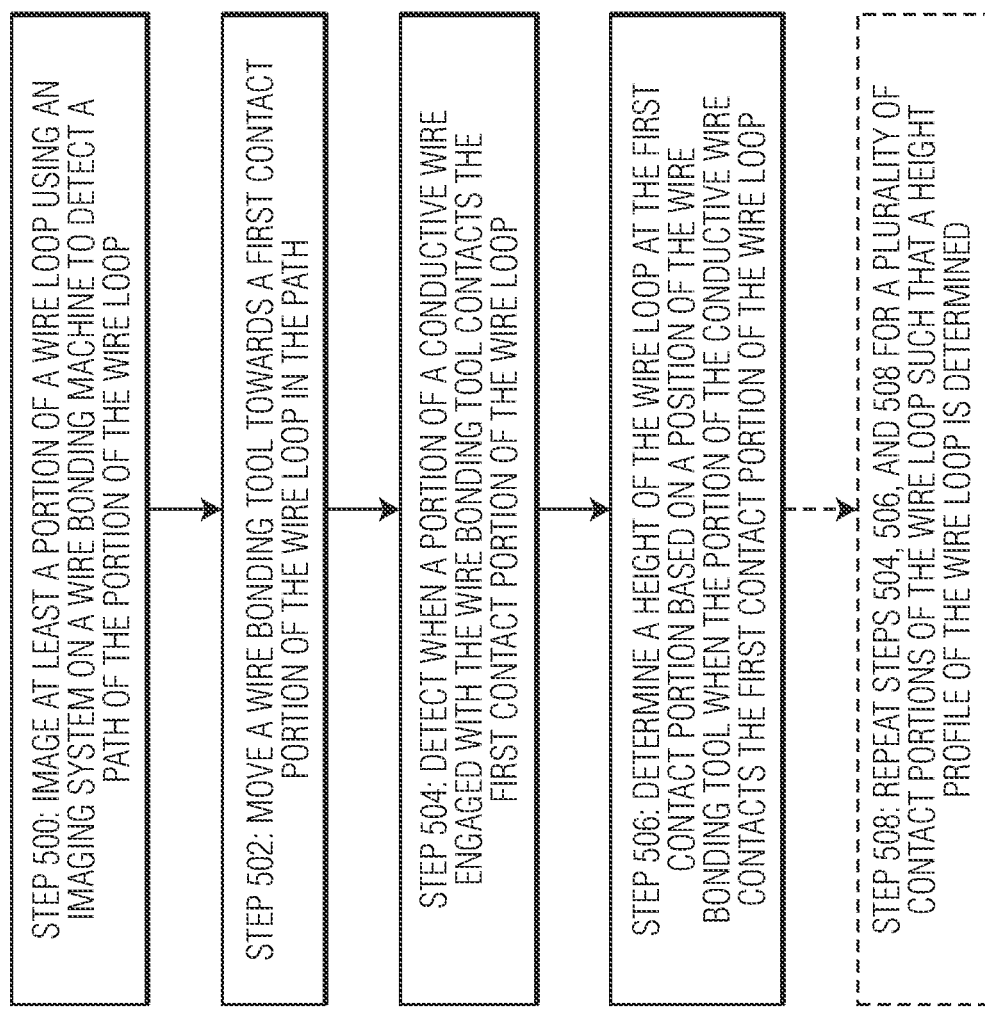
FIG. 5 is a flow diagram illustrating a method of determining a height of a wire loop in accordance with an exemplary embodiment of the invention.
Figure 6:
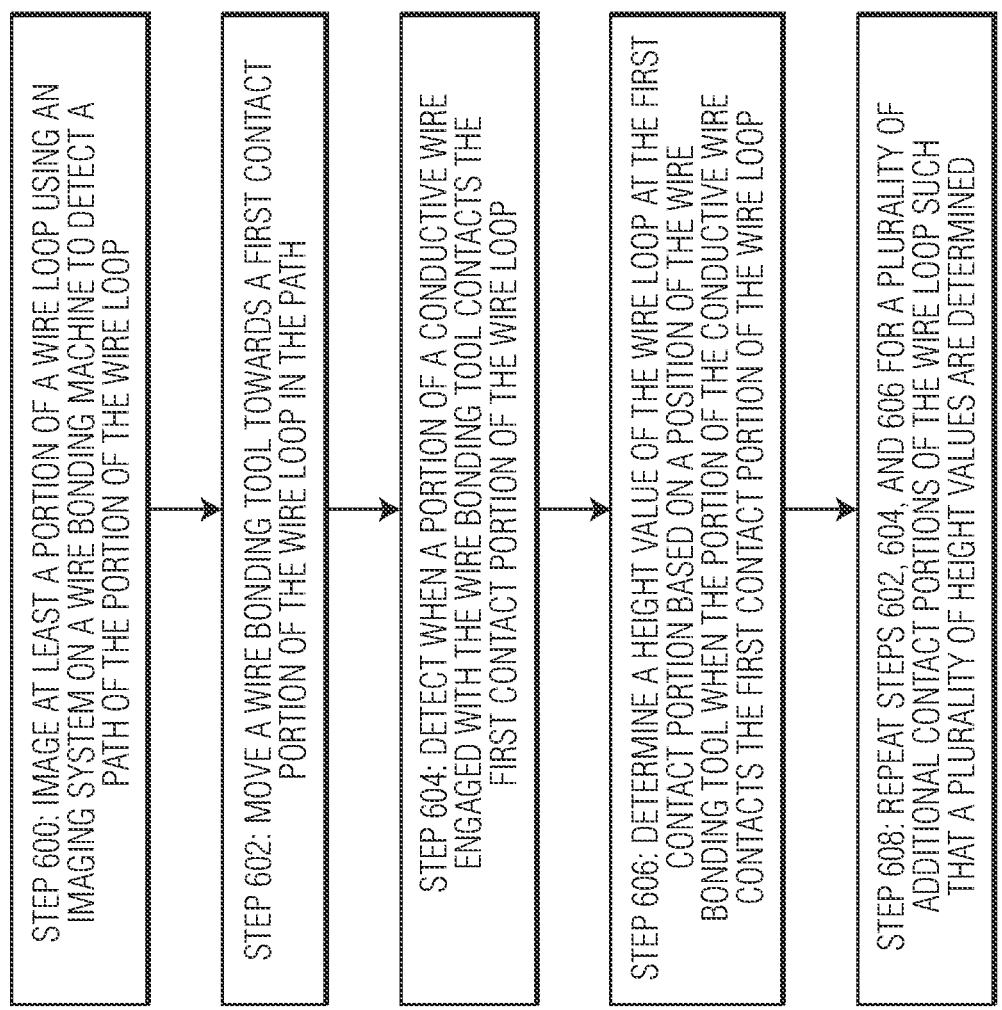
FIG. 6 is a flow diagram illustrating a method of determining a height profile of a wire loop in accordance with an exemplary embodiment of the invention.

FIG. 5 is a flow diagram illustrating a method of determining a height of a wire loop, and FIG. 6 is a flow diagram illustrating a method of determining a height profile of a wire loop. As is understood by those skilled in the art, certain steps included in the flow diagrams may be omitted; certain additional steps may be added; and the order of the steps may be altered from the order illustrated—all within the scope of the invention.

Referring now to FIG. 5, at Step 500 at least a portion of a wire loop is imaged using an imaging system on a wire bonding machine to detect a path of the portion of the wire loop (e.g., see FIGS. 2A-2C, FIG. 3A, and FIG. 4A). The detected path of the portion of the wire loop provides location data of the portion of the wire loop, in the x-y plane, for use in Step 502. At Step 502, a wire bonding tool is moved towards a first contact portion of the wire loop in the path (e.g., see FIG. 2D, FIG. 3B, and FIG. 4B). At Step 504, it is detected (e.g., using detection system 120) when a portion of a conductive wire engaged with the wire bonding tool contacts the first contact portion of the wire loop (e.g., see FIG. 2D, FIG. 3B, and FIG. 4B). At Step 506, a height value of the wire loop is determined at the first contact portion based on a position of the wire bonding tool when the portion of the conductive wire contacts the first contact portion of the wire loop. At optional Step 508, Steps 502, 504, and 506 are repeated for a plurality of contact portions of the wire loop such that a plurality of height values are determined (e.g., see FIGS. 2D-2G).

Referring now to FIG. 6, at Step 600 at least a portion of a wire loop is imaged using an imaging system on a wire bonding machine to detect a path of the portion of the wire loop (e.g., see FIGS. 2A-2C, FIG. 3A, and FIG. 4A). The detected path of the portion of the wire loop provides location data of the portion of the wire loop, in the x-y plane, for use in Step 602. At Step 602, a wire bonding tool is moved towards a first contact portion of the wire loop in the path (e.g., see FIG. 2D, FIG. 3B, and FIG. 4B). At Step 604, it is detected when a portion of a conductive wire engaged with the wire bonding tool contacts the first contact portion of the wire loop (e.g., see FIG. 2D, FIG. 3B, and FIG. 4B). At Step 606, a height value of the wire loop is determined at the first contact portion based on a position of the wire bonding tool when the portion of the conductive wire contacts the first contact portion of the wire loop. At Step 608, Steps 602, 604, and 606 are repeated for a plurality of contact portions of the wire loop such that a plurality of height values are determined.

Although the invention has been illustrated and described primarily with regard to specific and simple wire loops (e.g., wire loop 116 including a first bonding location on semiconductor element 108 and a second bonding location on a substrate 110), the invention is not limited thereto. Wire loops may provide electrical interconnection in any type of workpiece (not just a semiconductor element on a substrate). Further, wire loops may have any number of bonded portions. For example, a wire loop may have two bonded portions (e.g., a first bond and a second bond, like wire loop 116), three bonded portions, etc. Further, a wire loop may have a single bonded portion (e.g., a conductive bump). That is, as used herein, the term "wire loop" may include a conductive bump formed using a portion of wire (e.g., see U.S. Pat. No. 7,188,759).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a height value of a wire loop on a wire bonding machine, the method comprising the steps of:
   (a) imaging at least a portion of a wire loop using an imaging system on a wire bonding machine to detect a path of the portion of the wire loop;
   (b) moving a wire bonding tool towards a first contact portion of the wire loop in the path;
   (c) detecting when a portion of a conductive wire engaged with the wire bonding tool contacts the first contact portion of the wire loop; and
   (d) determining a height value of the wire loop at the first contact portion based on a position of the wire bonding tool when the portion of the conductive wire contacts the first contact portion of the wire loop.

2. The method of claim 1 further comprising (e) repeating steps (b), (c), and (d) for a plurality of additional contact portions of the wire loop such that a plurality of height values are determined.

3. The method of claim 2 wherein the plurality of contact portions of the wire loop are spaced at predetermined increments between a first bonding point of the wire loop and a second bonding point of the wire loop.

4. The method of claim 1 wherein the portion of the conductive wire is a free air ball seated at the tip of the bonding tool.

5. The method of claim 1 wherein step (c) includes detecting when a conductive path is established between (i) the first contact portion of the wire loop, and (ii) the portion of the conductive wire.

6. The method of claim 1 wherein step (a) includes imaging an entire length of the wire loop using the imaging system.

7. The method of claim 1 wherein step (a) includes imaging an entire length of the wire loop in a single field of view of the imaging system.

8. The method of claim 1 wherein step (a) includes imaging an entire length of the wire loop in a plurality of fields of view of the imaging system.

9. The method of claim 1 wherein step (a) includes imaging only a portion of the wire loop using the imaging system.

10. The method of claim 1 wherein the portion of the wire loop imaged using the imaging system includes a high point of the wire loop.

11. The method of claim 1 wherein the first contact portion is at a high point of the wire loop.

12. The method of claim 1 wherein the imaging in step (a) detects a path of the portion of the wire loop including wire sway.

13. A method of determining a height profile of a wire loop on a wire bonding machine, the method comprising the steps of:
   (a) imaging at least a portion of a wire loop using an imaging system on a wire bonding machine to detect a path of the portion of the wire loop;
   (b) moving a wire bonding tool towards a first contact portion of the wire loop in the path;
   (c) detecting when a portion of a conductive wire engaged with the wire bonding tool contacts the first contact portion of the wire loop;
   (d) determining a height value of the wire loop at the first contact portion based on a position of the wire bonding tool when the portion of the conductive wire contacts the first contact portion of the wire loop; and
   (e) repeating steps (b), (c), and (d) for a plurality of additional contact portions of the wire loop such that a plurality of height values are determined.

14. The method of claim 13 wherein the first contact portion, and the plurality of additional contact portions, are spaced at predetermined increments between a first bonding point of the wire loop and a second bonding point of the wire loop.

15. The method of claim 13 wherein the portion of the conductive wire is a free air ball seated at the tip of the bonding tool.

16. The method of claim 13 wherein step (b) includes detecting when a conductive path is established between (a) the first contact portion of the wire loop, and (b) the portion of the conductive wire.

17. The method of claim 13 wherein step (a) includes imaging an entire length of the wire loop in a single field of view of the imaging system.

18. The method of claim 13 wherein step (a) includes imaging an entire length of the wire loop in a plurality of fields of view of the imaging system.

19. The method of claim 13 wherein the first contact portion is at a high point of the wire loop.

20. The method of claim 13 wherein the imaging in step (a) detects a path of the portion of the wire loop including wire sway.

\* \* \* \* \*